(12) United States Patent
Chen et al.

(10) Patent No.: US 7,892,935 B2
(45) Date of Patent: Feb. 22, 2011

(54) SEMICONDUCTOR PROCESS

(75) Inventors: Yi-Wei Chen, Taichung County (TW); Chao-Ching Hsieh, Hsinchu Hsien (TW); Tsai-Fu Hsiao, Hsinchu (TW); Yu-Lan Chang, Kaohsiung (TW); Tsung-Yu Hung, Tainan County (TW); Chun-Chieh Chang, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 709 days.

(21) Appl. No.: 11/564,850

(22) Filed: Nov. 30, 2006

(65) Prior Publication Data

US 2008/0132023 A1 Jun. 5, 2008

(51) Int. Cl.
*H01L 21/31* (2006.01)
*H01L 21/22* (2006.01)
*H01L 21/42* (2006.01)
*H01L 21/331* (2006.01)

(52) U.S. Cl. ............ 438/365; 438/245; 438/301; 438/714; 257/61; 257/E21.075; 257/E21.284; 257/E21.301; 257/E33.004

(58) Field of Classification Search .......... 438/365, 438/514, 766, 245, 301; 257/61, E33.004, 257/E33.316, E21.075, E21.284, E21.301
See application file for complete search history.

(56) References Cited

U.S. PATENT DOCUMENTS

| 6,030,863 | A | 2/2000 | Chang et al. | |
|---|---|---|---|---|
| 6,077,750 | A * | 6/2000 | Sohn et al. | 438/303 |
| 6,100,142 | A | 8/2000 | Liao | |
| 6,225,176 | B1 * | 5/2001 | Yu | 438/305 |
| 6,297,115 | B1 * | 10/2001 | Yu | 438/305 |
| 6,391,731 | B1 * | 5/2002 | Chong et al. | 438/303 |
| 6,682,980 | B2 * | 1/2004 | Chidambaram et al. | 438/302 |
| 2004/0087121 | A1 * | 5/2004 | Kammler et al. | 438/528 |
| 2007/0181955 | A1 * | 8/2007 | Chen et al. | 257/384 |
| 2007/0281413 | A1 * | 12/2007 | Li et al. | 438/201 |

OTHER PUBLICATIONS

Greg T. Sarcona, Polysilicon Thin-Film Transistors Using Self-Aligned Cobalt and Nickel Silicide Source and Drain Contacts, IEEE Electron Device Letters vol. 20. No. 7. Jul. 1999. pp. 332-334.*
"Office Action of Taiwan counterpart application", issued on Jul. 29, 2009, p. 1-p. 5.

* cited by examiner

*Primary Examiner*—Long K Tran
(74) *Attorney, Agent, or Firm*—WPAT, PC; Justin King

(57) ABSTRACT

A semiconductor process is provided. The semiconductor process includes providing a substrate. Then, a surface treatment is performed to the substrate to form a buffer layer on the substrate. Next, a first pre-amorphous implantation is performed to the substrate.

12 Claims, 4 Drawing Sheets

SEMICONDUCTOR PROCESS

BACKGROUND OF THE INVENTION

1. Field of the Invention

The present invention relates to a semiconductor process, and more particularly, to a semiconductor process capable of avoiding diode leakage problem.

2. Description of Related Art

With the rapid miniaturization and high level integration of integrated circuits, feature line width, contact area and junction depth are continuously minimized. To effectively improve the working characteristics of devices and reduce the resistance of resistors and the resistor/capacitor signal transmission delay, a silicide layer is often formed at junctions to lower contact resistance.

In the conventional self-aligned silicide process, a nickel silicide (NiSi) layer is normally formed on the surface of the gate and the source/drain of a metal-oxide-semiconductor (MOS) transistor. However, the presence of a nickel silicide layer frequently produces piping problem. In other words, after forming the nickel silicide layer, the nickel silicide may diffuse laterally into the silicon substrate and the channel and lead to current leakage. To resolve the piping problem of the nickel silicide layer, a pre-amorphous implantation (PAI) process is often carried out which implants indium or arsenic atoms into the surface of the silicon substrate before forming the nickel silicide layer so as to prevent any lateral diffusion of the nickel silicide.

FIGS. 1A through 1C are schematic cross-sectional views showing a conventional semiconductor process for preventing the lateral diffusion of nickel silicide. First, as shown in FIG. 1A, a substrate 100 is provided. The substrate 100 has a shallow trench isolation (STI) structure 102 formed therein. Furthermore, the substrate 100 has a metal-oxide-semiconductor transistor 104 formed thereon. The MOS transistor 104 includes a gate 106, a gate dielectric layer 108, spacers 110 and source/drain regions 112. Then, a pre-amorphous implantation 114 is performed on the substrate 100 to form an amorphous silicon layer 116 on the source/drain regions 112 (as shown in FIG. 1B). Next, as shown in FIG. 1C, a self-aligned silicide process (salicide) process is carried out to form a nickel silicide layer 120 on the source/drain regions 112 and the gate 106.

However, in the aforementioned process of forming the amorphous silicon layer 116, the amorphous silicon layer 116 often has a greater thickness toward the corner regions 118 of the shallow trench isolation structure 102. Therefore, the subsequently formed nickel silicide layer 120 will have a greater thickness as the same corner regions 118 so that diode leakage problem may occur.

SUMMARY OF THE INVENTION

Accordingly, at least one objective of the present invention is to provide a semiconductor process capable of preventing the formation of a thicker amorphous silicon layer after performing a pre-amorphous implantation.

At least another objective of the present invention is to provide a semiconductor process capable of avoiding the diode leakage problem.

To achieve these and other advantages and in accordance with the purpose of the invention, as embodied and broadly described herein, the invention provides a semiconductor process. The semiconductor process includes providing a substrate. Then, a surface treatment is performed to the substrate to form a buffer layer on the substrate. A first pre-amorphous implantation is performed to the substrate.

According to the semiconductor process in the embodiment of the present invention, the surface treatment is a second pre-amorphous implantation, for example. Furthermore, the ion implant energy level for the second pre-amorphous implantation is smaller than that of the first pre-amorphous implantation, for example.

According to the semiconductor process in the embodiment of the present invention, the ion implant energy level for the second pre-amorphous implantation is between 5 KeV to 10 KeV, for example.

According to the semiconductor process in the embodiment of the present invention, the ion implant dosage for the second pre-amorphous implantation is between $1 \times 10^{13}$ atom/cm$^2$ to $7 \times 10^{13}$ atom/cm$^2$, for example.

According to the semiconductor process in the embodiment of the present invention, the ion implant angle for the second pre-amorphous implantation is between 0° to 20°, for example.

According to the semiconductor process in the embodiment of the present invention, the ions used in the second pre-amorphous implantation are indium, nitrogen, silicon, germanium or arsenic, for example.

According to the semiconductor process in the embodiment of the present invention, the surface treatment is a plasma treatment or a chemical treatment, for example.

According to the semiconductor process in the embodiment of the present invention, the ion implant energy level for the first pre-amorphous implantation is between 10 KeV to 20 KeV, for example.

According to the semiconductor process in the embodiment of the present invention, the ion implant dosage for the first pre-amorphous implantation is between $5 \times 10^{13}$ atom/cm$^2$ to $3 \times 10^{14}$ atom/cm$^2$, for example.

According to the semiconductor process in the embodiment of the present invention, the ion implant angle for the first pre-amorphous implantation is between 0° to 20°, for example.

According to the semiconductor process in the embodiment of the present invention, the ions used in the first pre-amorphous implantation are indium, nitrogen, silicon, germanium or arsenic, for example.

The present invention also provides another semiconductor process. The semiconductor process includes providing a substrate. The substrate has an active region and the active region of the substrate has a metal-oxide-semiconductor transistor formed thereon. Then, a surface treatment is performed to the active region of the substrate to form a buffer layer on the source/drain regions of the MOS transistor. Next, a first pre-amorphous implantation is performed to the active region of the substrate. After that, a silicide layer is formed on the source/drain region.

According to the semiconductor process in the embodiment of the present invention, the material constituting the silicide layer includes, for example, nickel silicide (NiSi), nickel platinum silicide (NiPtSi), nickel cobalt silicide (NiCoSi) or nickel titanium silicide (NiTiSi).

According to the semiconductor process in the embodiment of the present invention, the method of forming the silicide layer includes, for example, performing a self-aligned silicide process.

In the present invention, a thinner and smoother interface buffer layer is formed on the substrate before performing a pre-amorphous implantation. Then, the familiar pre-amorphous implantation is carried out. In this way, the problem of generating a thicker amorphous silicon layer near the corner regions of the shallow trench isolation structure through a direct pre-amorphous implantation is avoided. Consequently, the formation of a thick silicide layer near the corner regions of the STI structure in a subsequent salicide process can be avoided. Thus, the diode leakage problem can be minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
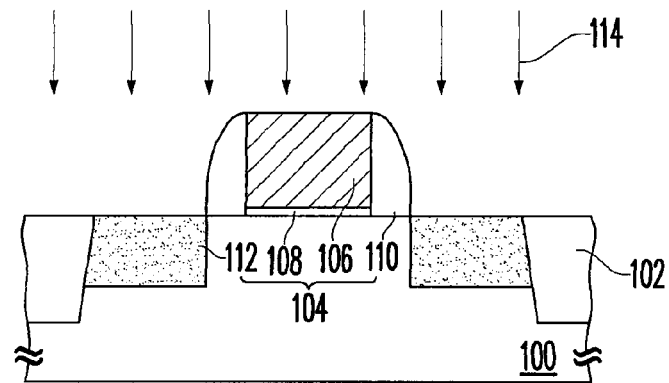
FIGS. 1A through 1C are schematic cross-sectional views showing a conventional semiconductor process for preventing the lateral diffusion of nickel silicide.
Figure 1B:
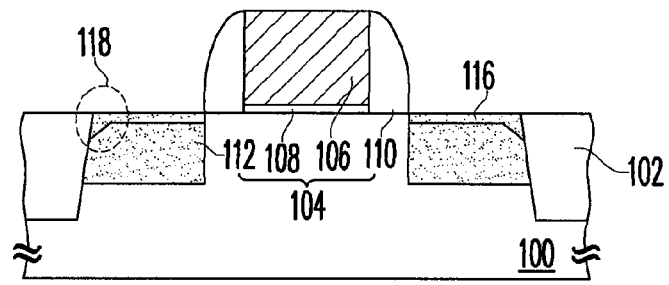
Figure 1C:
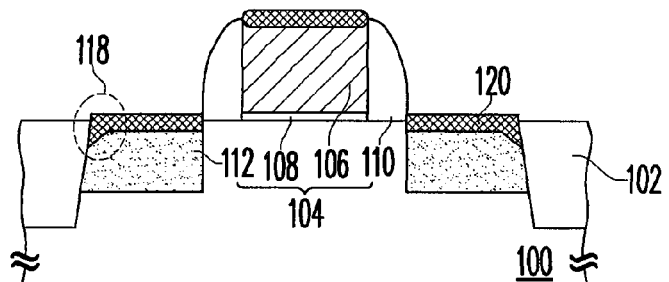

Reference will now be made in detail to the present preferred embodiments of the invention, examples of which are illustrated in the accompanying drawings. Wherever possible, the same reference numbers are used in the drawings and the description to refer to the same or like parts.

Figure 2:
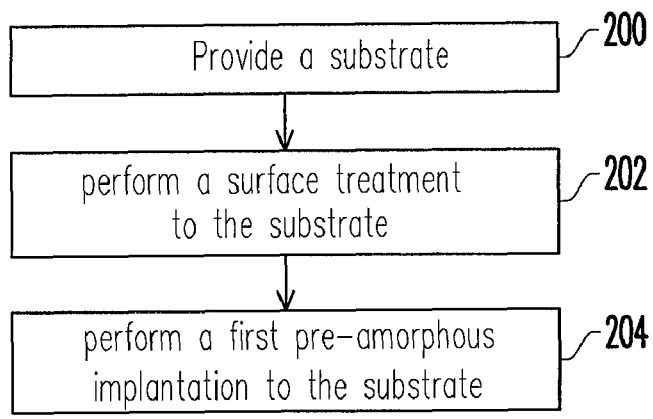
FIG. 2 is a flow diagram showing the steps in a semiconductor process according to one embodiment of the present invention.

FIG. 2 is a flow diagram showing the steps in a semiconductor process according to one embodiment of the present invention. As shown in FIG. 2, a substrate is provided in step 200. The substrate is a polysilicon substrate, for example. Then, in step 202, a surface treatment is performed to the substrate to form a buffer layer on the substrate. The surface treatment is, for example, a pre-amorphous implantation capable of forming a thin and planar amorphous silicon layer on the surface of the substrate to serve as a buffer layer. In the pre-amorphous implantation, ions such as indium, nitrogen, silicon, germanium or arsenic are implanted using an implant energy level between 5 KeV to 10 KeV, an ion implant dosage between $1 \times 10^{13}$ atom/cm$^2$ to $7 \times 10^{13}$ atom/cm$^2$ and an ion implant angle between 0° to 20°, the best is 7°, for example. Then, another pre-amorphous implantation to the substrate is performed in step 204. In the second pre-amorphous implantation, ions such as indium, nitrogen, silicon, germanium or arsenic are implanted using an implant energy level between 10 KeV to 20 KeV, an ion implant dosage between $5 \times 10^{13}$ atom/cm$^2$ to $3 \times 10^{14}$ atom/cm$^2$ and an ion implant angle between 0° to 20°, the best is 7°, for example.

It should be noted that the main purpose of performing the surface treatment is to form a thin and smooth amorphous silicon layer on the substrate to serve as a buffer layer so that the formation of a thick amorphous silicon layer on the substrate due to the relatively high ion implant energy level in a direct pre-amorphous implantation can be avoided. Therefore, the ion implant energy level in the surface treatment must be smaller than that of the subsequent pre-amorphous implantation.

In another embodiment, the foregoing surface treatment can be a plasma treatment process or a chemical treatment process. When the surface treatment is a plasma treatment process, plasma is accelerated to bombard the surface of the substrate and break up the crystal lattice near the surface of the substrate so that an amorphous silicon layer, serving as a buffer layer, is formed on the surface of the substrate. Alternatively, when the surface treatment is a chemical treatment process, the substrate is directly immersed in a chemical solution so that the surface of the substrate reacts with the chemical solution to form a thin oxide layer, serving as a buffer layer, on the surface of the substrate. Thus, either the plasma treatment process or the chemical treatment process can be used as a surface treatment process for forming a buffer layer over the substrate so that the formation of a too thick amorphous silicon layer through a direct pre-amorphous implantation can be prevented.

Figure 3A:
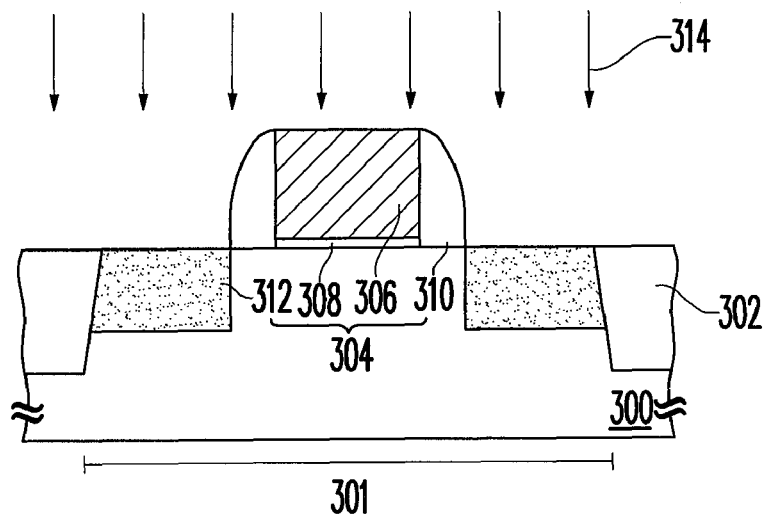
FIGS. 3A through 3E are schematic cross-sectional views showing the steps in a semiconductor process according to another embodiment of the present invention.
Figure 3B:
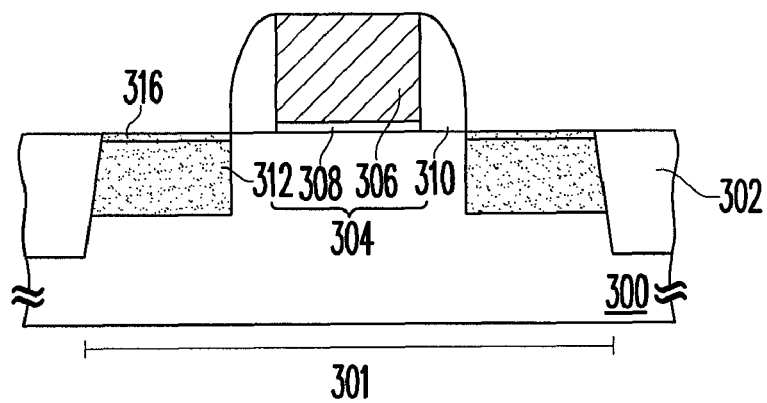

FIGS. 3A through 3E are schematic cross-sectional views showing the steps in a semiconductor process according to another embodiment of the present invention. First, as shown in FIG. 3A, a substrate 300 is provided. The substrate 300 is a polysilicon substrate, for example, and has a shallow trench isolation structure 302 formed therein. Furthermore, the substrate 300 has an active region 301 and a metal-oxide-semiconductor transistor 304 is formed on the active region 301 of the substrate 300. The MOS transistor 304 includes a gate 306, a gate dielectric layer 308, spacers 310 and source/drain regions 312. Then, a surface treatment to the active region 301 of the substrate 300 is performed to form a buffer layer 316 on the source/drain regions 312 (as shown in FIG. 3B). The surface treatment 314 is, for example, a pre-amorphous implantation (as shown in FIG. 3A') that can form a thin and smooth amorphous silicon layer, serving as the buffer layer 316, on the source/drain regions 312. In the pre-amorphous implantation, ions such as indium, nitrogen, silicon, germanium or arsenic are implanted using an implant energy level between 5 KeV to 10 KeV, an ion implant dosage between $1 \times 10^{13}$ atom/cm$^2$ to $7 \times 10^{13}$ atom/cm$^2$ and an ion implant angle between 0° to 20°, the best is 7°, for example.

In another embodiment, the surface treatment 314 can be a plasma treatment process. Plasma is accelerated to directly bombard the active region 301 of the substrate 300 and break up the crystal lattice near the surface of the substrate 300 so that an amorphous silicon layer, serving as the buffer layer 316, is formed on the source/drain regions 312. In yet another embodiment, the surface treatment 314 can be a chemical treatment process. The substrate 300 is directly immersed in a chemical solution so that the surface of the substrate 300 reacts with the chemical solution and forms a thin oxide layer, serving as the buffer layer 316, on the source/drain regions 312.

Figure 3C:
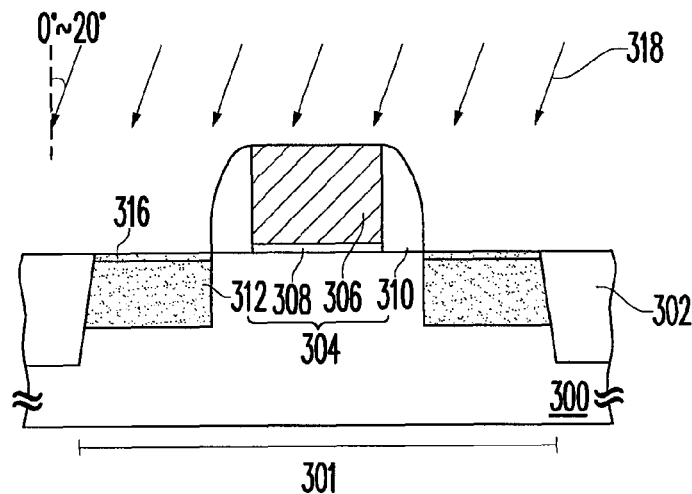
Figure 3D:
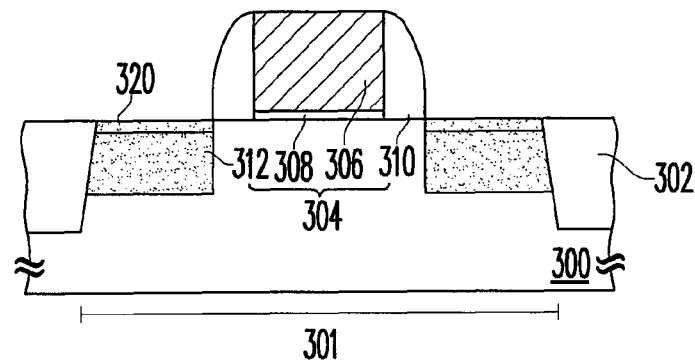

Next, as shown in FIGS. 3C and 3D, a pre-amorphous implantation 318 to the active region of the substrate 300 is performed to form an amorphous silicon layer 320 on the source/drain regions 312. In the pre-amorphous implantation 318, ions such as indium, nitrogen, silicon, germanium or arsenic are implanted using an implant energy level between 10 KeV to 20 KeV, an ion implant dosage between $5 \times 10^{13}$ atom/cm$^2$ to $3 \times 10^{14}$ atom/cm$^2$ and an ion implant angle between 0° to 20°, the best is 7°, for example.

It should be noted that a surface treatment 314 to the active region 301 of the substrate 300 has already been performed to form the buffer layer 316 on the surface of the active region 301 of the substrate 300 before carrying out the pre-amorphous implantation 318. The buffer layer 316 serves as a buffer mask in the pre-amorphous implantation to prevent the problem of generating too thick an amorphous silicon layer near the corner regions of the STI structure when the pre-amorphous implantation 318 is directly performed.

In addition, the buffer layer 316 should be a thin and smooth amorphous silicon layer if the surface treatment 314 is a pre-amorphous implantation. Therefore, the ion implant energy level of the pre-amorphous implantation for forming the buffer layer 316 must be smaller than that of the pre-amorphous implantation 318. Furthermore, because the only difference between the two pre-amorphous implantation processes is their implant energy levels, only their implant depths are affected. Thus, after performing the pre-amorphous implantation 318, a deeper amorphous silicon layer 320 is formed and the buffer layer 316 will become part of the amorphous silicon layer 320.

Figure 3E:
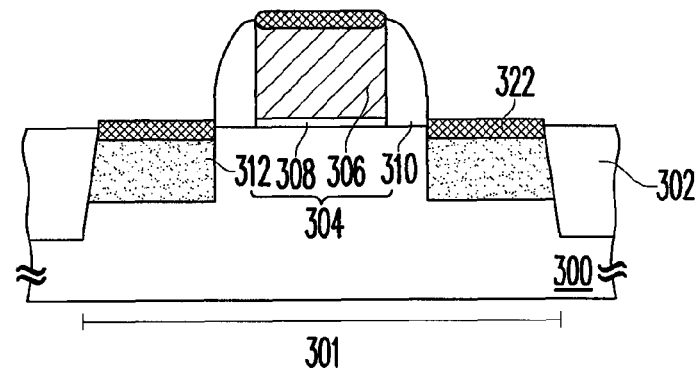
Figure 3A:
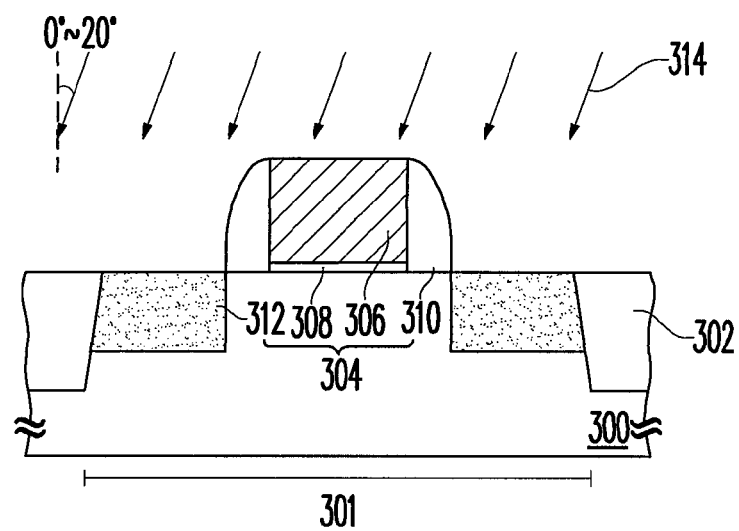

As shown in FIG. 3E, a silicide layer 322 is formed on the source/drain regions 312 and the gate 308. The silicide layer 322 is a nickel silicide layer, a nickel platinum silicide layer, a nickel cobalt silicide layer or a nickel titanium silicide layer formed, for example, by performing a self-aligned silicide process.

It should be noted that the performance of the pre-amorphous implantation 318 before forming the silicide layer 322 can prevent the lateral diffusion of the silicide material into the substrate underneath the spacers 310 and avoid current leakage problem. In addition, the active region 301 of the substrate 300 is surface-treated so that too thick an amorphous silicon layer will not form near the corner regions of the STI structure 302. Without forming too thick a silicide layer near the corner regions of the STI structure 302, diode leakage problem can also be avoided.

In summary, a thin and smooth buffer layer is formed on the substrate prior to performing the familiar pre-amorphous implantation in the present invention. Thus, the production of a thick amorphous silicon layer near the corner regions of an STI structure due to the direct performance of a pre-amorphous implantation is avoided.

Furthermore, by limiting the thickness of the amorphous silicon layer near the corner regions of an STI structure after the pre-amorphous implantation, diode leakage problem caused by the formation of a thicker silicide layer near the corner regions of an STI structure is also avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor process, comprising:
    providing a substrate;
    performing a surface treatment to the substrate to form a buffer layer on the substrate; and
    performing a first pre-amorphous implantation to the substrate with the buffer layer, wherein the surface treatment is a plasma treatment process or a chemical treatment process and the buffer layer is an amorphous silicon layer or an oxide layer respectively.

2. The semiconductor process of claim 1, wherein the ion implant energy level of the first pre-amorphous implantation is between 10 KeV to 20 KeV.

3. The semiconductor process of claim 1, wherein the ion implant dosage of the first pre-amorphous implantation is between $5 \times 10^{13}$ atom/cm$^2$ to $3 \times 10^{14}$ atom/cm$^2$.

4. The semiconductor process of claim 1, wherein the ion implant angle of the first pre-amorphous implantation from an axis perpendicular to the surface of the substrate is between 0° to 20°.

5. The semiconductor process of claim 1, wherein the ions used in the first pre-amorphous implantation comprises indium, nitrogen, silicon, germanium or arsenic.

6. A semiconductor process, comprising:
    providing a substrate having an active region and a metal-oxide-semiconductor transistor on the active region of the substrate, wherein the metal-oxide-semiconductor is formed with a gate, a gate dielectric layer, spacers and source/drain regions;
    performing a surface treatment to the active region of the substrate to form a buffer layer in the source/drain regions of the MOS transistor;
    performing a first pre-amorphous implantation to the active region of the substrate with the buffer layer to form an amorphous semiconductor layer in the source/drain regions, the buffer layer becoming a part of the amorphous semiconductor layer; and
    forming a silicide layer on the source/drain regions after the first pre-amorphous implantation.

7. The semiconductor process of claim 6, wherein the ion implant energy level of the first pre-amorphous implantation is between 10 KeV to 20 KeV.

8. The semiconductor process of claim 6, wherein the ion implant dosage of the first pre-amorphous implantation from an axis perpendicular to the surface of the substrate is between $5 \times 10^{13}$ atom/cm$^2$ to $3 \times 10^{14}$ atom/cm$^2$.

9. The semiconductor process of claim 6, wherein the ion implant angle of the first pre-amorphous implantation is between 0° to 20°.

10. The semiconductor process of claim 6, wherein the ions used in the first pre-amorphous implantation comprises indium, nitrogen, silicon, germanium or arsenic.

11. The semiconductor process of claim 6, wherein the material constituting the silicide layer is selected from a group consisting of nickel silicide, nickel platinum silicide, nickel cobalt silicide and nickel titanium silicide.

12. The semiconductor process of claim 6, wherein the step of forming the silicide layer comprises performing a self-aligned silicide process.

* * * * *